(12) United States Patent
Yoshimi et al.

(10) Patent No.: US 10,468,586 B2
(45) Date of Patent: Nov. 5, 2019

(54) ELECTRONIC DEVICE, TOPOLOGICAL INSULATOR, FABRICATION METHOD OF TOPOLOGICAL INSULATOR AND MEMORY DEVICE

(71) Applicant: RIKEN, Saitama (JP)

(72) Inventors: Ryutaro Yoshimi, Saitama (JP); Masataka Mogi, Tokyo (JP); Naoto Nagaosa, Tokyo (JP); Masashi Kawasaki, Saitama (JP); Yoshinori Tokura, Saitama (JP); Wataru Koshibae, Saitama (JP)

(73) Assignee: RIKEN, Saitama (JP)

(*) Notice: Subject to any disclaimer, the term of this patent is extended or adjusted under 35 U.S.C. 154(b) by 0 days.

(21) Appl. No.: 15/894,904

(22) Filed: Feb. 12, 2018

(65) Prior Publication Data
US 2018/0175285 A1 Jun. 21, 2018

Related U.S. Application Data

(63) Continuation of application No. PCT/JP2016/072542, filed on Aug. 1, 2016.

(30) Foreign Application Priority Data

Aug. 14, 2015 (JP) .................. 2015-160198

(51) Int. Cl.
*H01L 43/06* (2006.01)
*H01L 27/105* (2006.01)
(Continued)

(52) U.S. Cl.
CPC .............. *H01L 43/06* (2013.01); *G11C 11/15* (2013.01); *G11C 11/161* (2013.01); *G11C 11/18* (2013.01);
(Continued)

(58) Field of Classification Search
CPC ....... H01L 27/105; H01L 29/82; H01L 27/22; H01L 43/06; H01L 43/10; H01L 43/14;
(Continued)

(56) References Cited

U.S. PATENT DOCUMENTS

| 3,956,769 A * | 5/1976 | Beecroft ................ G11B 5/265 360/77.11 |
| 2006/0044946 A1* | 3/2006 | Phillips ............. G11B 11/10582 369/13.09 |

(Continued)

FOREIGN PATENT DOCUMENTS

WO 2009/133744 A1 11/2009

OTHER PUBLICATIONS

K.V.Klitzing, G. Dorda, and M. Pepper, "New Method for High-Accuracy Determination of the Fine-Structure Constant Based on Quantized Hall Resistance", Physical Review Letters, Aug. 11, 1980, pp. 494-497, vol. 45, No. 6.

(Continued)

*Primary Examiner* — Ahmed N Sefer

(57) ABSTRACT

An electronic device is provided, including: a first drive electrode; a second drive electrode that is spaced apart from the first drive electrode; and a topological insulator that contacts both of the first drive electrode and the second drive electrode and has magnetism, wherein the topological insulator includes a first region having a first coercivity and a second region having a second coercivity that is different from the first coercivity. A fabrication method of a topological insulator is also provided, including: preparing a topological insulator having magnetism and a first coercivity; and forming a second region having a second coercivity that is different from the first coercivity by irradiating a partial region of the topological insulator with ions.

13 Claims, 21 Drawing Sheets

(51) Int. Cl.
| | |
|---|---|
| *H01L 29/82* | (2006.01) |
| *G11C 11/16* | (2006.01) |
| *H01F 10/32* | (2006.01) |
| *H01L 27/22* | (2006.01) |
| *H01L 43/10* | (2006.01) |
| *H01L 43/14* | (2006.01) |
| *H01F 10/26* | (2006.01) |
| *H01F 1/00* | (2006.01) |
| *G11C 11/15* | (2006.01) |
| *G11C 11/18* | (2006.01) |
| *G11C 11/56* | (2006.01) |
| *H01L 43/08* | (2006.01) |
| *H01L 43/12* | (2006.01) |

(52) U.S. Cl.
CPC ........ *G11C 11/5607* (2013.01); *H01F 1/0063* (2013.01); *H01F 10/265* (2013.01); *H01F 10/3286* (2013.01); *H01L 27/105* (2013.01); *H01L 27/22* (2013.01); *H01L 29/82* (2013.01); *H01L 43/08* (2013.01); *H01L 43/10* (2013.01); *H01L 43/12* (2013.01); *H01L 43/14* (2013.01)

(58) Field of Classification Search
CPC ....... H01L 43/08; H01L 43/12; G11C 11/161; G11C 11/15; G11C 11/18; G11C 11/5607; H01F 10/3286; H01F 10/265; H01F 1/0063

See application file for complete search history.

(56) References Cited

U.S. PATENT DOCUMENTS

| | | | | |
|---|---|---|---|---|
| 2006/0215442 A1* | 9/2006 | Wunderlich | ............ | G11C 11/16 365/157 |
| 2011/0097822 A1* | 4/2011 | Lee | .................. | H01L 21/31053 438/5 |
| 2012/0120718 A1 | 5/2012 | Lou et al. | | |
| 2012/0138115 A1* | 6/2012 | Chen | ....................... | H01L 35/32 136/205 |
| 2014/0160835 A1 | 6/2014 | Soree et al. | | |
| 2014/0174343 A1 | 6/2014 | Xue | | |
| 2015/0138553 A1* | 5/2015 | Jeong | ................ | H01L 31/02325 356/369 |
| 2015/0221784 A1* | 8/2015 | McQueen | ......... | H01L 31/02242 257/459 |
| 2016/0169986 A1* | 6/2016 | Li | ......................... | G01R 33/096 324/228 |
| 2016/0284394 A1 | 9/2016 | Tominaga | | |
| 2017/0288666 A1* | 10/2017 | Flatte | ..................... | H03K 17/80 |

OTHER PUBLICATIONS

R.Yoshimi, A. Tsukazaki, Y. Kozuka, J. Falson,J.G.Checkelsky,K.S. Takahashi,N. Nagaosa,M. Kawasaki and Y.Tokura.,"Quantum Hall Effect on Top and Bottom Surface States of Topological Insulator $(Bi_1-xSBx)_2Te_3$ Films",Nature Communications, doi:10.1038/ncomms7627.

International Search Report for International Patent Application No. PCT/JP2016/072542, issued by the Japan Patent Office dated Sep. 13, 2016.

Extended European Search Report issued for European Patent Application No. 16836967.6 issued by the European Patent Office dated Jul. 19, 2018.

Yuhao Wang et al., "Design Exploration of Ultra-Low Power Non-volatile Memory based on Topological Insulator", International Symposium on Nanoscale Architectures , Jul. 4, 2012, pp. 30-35.

Saw Wai Hla, "Atom-by-atom assembly", Reports on Progress in Physics, vol. 77, No. 5, May 2, 2014, p. 56502, IOP Publishing Ltd, UK.

\* cited by examiner

ELECTRONIC DEVICE, TOPOLOGICAL INSULATOR, FABRICATION METHOD OF TOPOLOGICAL INSULATOR AND MEMORY DEVICE

BACKGROUND

1. Technical Field

The present invention relates to a topological insulator, an electronic device using a topological insulator, a memory device using a topological insulator and a fabrication method of a topological insulator.

2. Related Art

In general, an electronic device experiences energy dissipation due to electrical resistance. Such energy dissipation causes power consumption in electronic devices. Thus, achieving electrical conduction with very little or no energy dissipation allows us to develop electronic devices with significantly reduced power consumption.

The quantum Hall effect is known as a principle of electrical conduction with very little or no energy dissipation (see Non-Patent Document 1, for example). However, electrical conduction using the quantum Hall effect requires the application of a large external magnetic field of about several teslas (T) (see Non-Patent Document 1).

The following documents are provided as prior art documents.

PRIOR ART DOCUMENTS

Non-Patent Document

Non-Patent Document 1: K. v. Klitzing, G. Dorda, and M. Pepper, "New Method for High-Accuracy Determination of the Fine-Structure Constant Based on Quantized Hall Resistance", Phys. Rev. Lett. 45, 494 (1980)

Non-Patent Document 2: R. Yoshimi, A. Tsukazaki, Y. Kozuka, J. Falson, J. G. Checkelsky, K. S. Takahashi, N. Nagaosa, M. Kawasaki and Y. Tokura., "Quantum Hall Effect on Top and Bottom Surface States of Topological Insulator $(Bi_{1-x}Sb_x)_2Te_3$ Films", Nature Communications, doi: 10.1038/ncomms7627

Devices that do not require the application of a large external magnetic field are desired.

SUMMARY

A first aspect of the present invention provides an electronic device including: a first drive electrode; a second drive electrode that is spaced apart from the first drive electrode; and a topological insulator that contacts both of the first drive electrode and the second drive electrode and has magnetism, wherein The topological insulator includes a first region having a first coercivity and a second region having a second coercivity that is different from the first coercivity.

A second aspect of the present invention provides a topological insulator having magnetism, including: a first region having a first coercivity; and a second region having a second coercivity that is different from the first coercivity.

A third aspect of the present invention provides a fabrication method of a topological insulator, including: preparing a topological insulator having magnetism and a first coercivity; and forming a second region having a second coercivity that is different from the first coercivity by irradiating a partial region of the topological insulator with ions.

A fourth aspect of the present invention provides a memory device including: the electronic device according to the first aspect; and a detection unit to detect a direction of magnetization of each of the first region and the second region in the electronic device.

The summary clause does not describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
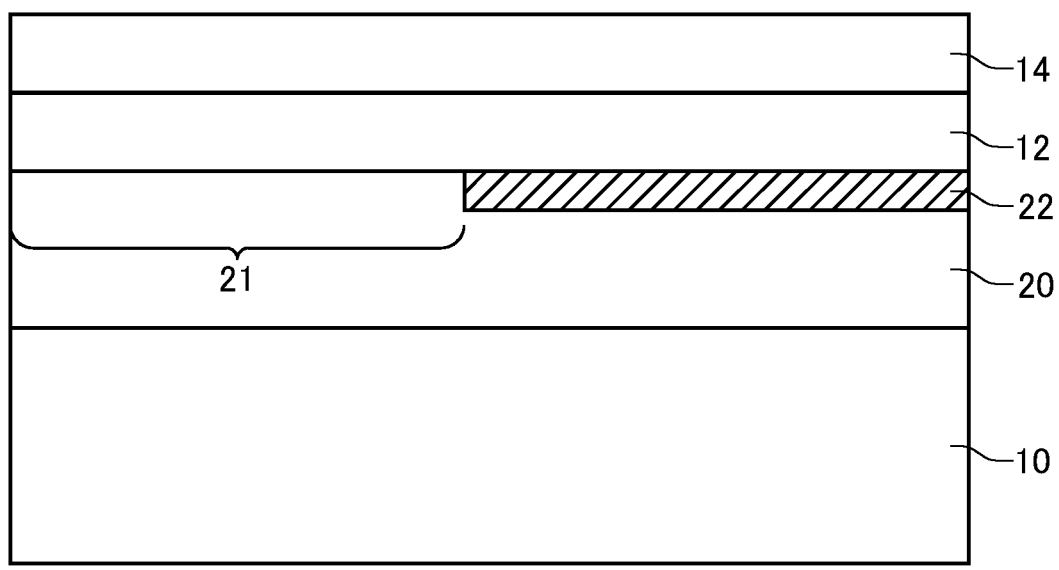
FIG. 1 is a schematic view of a cross section of a structure 100 including a topological insulator 20 having magnetism.

FIG. 1 is a schematic view of a cross section of a structure 100 including a topological insulator 20 having magnetism. The topological insulator refers to an insulator formed of an insulating material having strong spin-orbit interactions, the inside of which behaves as an insulator while its surface is in a metallic state having electrical conductivity. The surface of the topological insulator is in a "Dirac state", which allows electrical conduction without energy dissipation, in principle.

The structure 100 includes a substrate 10, a topological insulator 20, an insulating film 12 and an electrode 14. For example, the substrate 10 is an InP substrate. Note that the substrate 10 is not limited to an InP substrate, as long as the topological insulator 20 can be formed on its surface.

The topological insulator 20 has magnetism, in addition to the characteristics of the topological insulator described above. The topological insulator 20 generates magnetic fields in the direction perpendicular to the surface of the topological insulator 20 (which also means the direction perpendicular to the surface of the substrate 10 in the present example). In the present example, the topological insulator 20 has a thin-film shape, and generates magnetic fields in the direction perpendicular to the surface of the thin film.

As the topological insulator 20 generates magnetic fields in the perpendicular direction, electrons moving in the surface of the topological insulator 20 experience forces in the directions toward edges of the topological insulator 20. Thus, electrons move along the edges of the topological insulator 20.

Electrons moving in the surface of the topological insulator 20 experience forces from the magnetic fields according to the direction in which the electrons move. Thus, electrons moving along the opposing edges of the topological insulator 20 move in opposite directions. The direction in which electrons move is determined for each edge, and therefore the effect of electron scattering by impurities or the like is suppressed. Thus, the electrical conduction in the surface of the topological insulator 20 has very little or no energy dissipation.

By utilizing the characteristics of the material of the topological insulator 20 in this manner, electrical conduction at a relatively high temperature and with zero or very little energy dissipation can be achieved. In the present example, a quantum Hall effect is observed in the topological insulator 20 by measuring electrical conduction in the surface of the topological insulator 20 while varying a voltage applied to the electrode 14. As the topological insulator 20 itself has magnetism in this manner, electrical conduction with substantially no energy dissipation can be controlled without applying an external magnetic field.

The insulating film 12 is formed on the surface of the topological insulator 20. For example, the insulating film 12 is an insulating film of aluminum oxide or the like. The electrode 14 is formed on the surface of the insulating film 12. For example, the electrode 14 is an electrode of laminated layers of titanium and gold. The number of electrons in the surface of the topological insulator 20 is controlled by the voltage applied to the electrode 14.

Also, the topological insulator 20 includes a first region 21 having a first coercivity and a second region 22 having a second coercivity that is different from the first coercivity. The coercivity corresponds to the magnitude of an external magnetic field required to reverse the direction of magnetization of a magnetic material.

The first region 21 and the second region 22 are on the surface of the topological insulator 20. The topological insulator 20 is formed of a material having the first coercivity, and the second region 22 may be formed in a partial region of the topological insulator 20 on the surface side. The second region 22 may be formed extending from the top surface of the topological insulator 20 to a predetermined depth that does not reach its bottom surface, or may be formed extending from the top surface of the topological insulator 20 to its bottom surface.

As the topological insulator 20 includes two regions having different coercivities, the direction of the magnetic field can be controlled for each region. For example, the direction of the magnetic field of each region can be controlled by applying an external magnetic field. For example, the topological insulator 20 can be used as a memory by controlling the direction of the magnetic field of each region according to information to be stored. In this case, the topological insulator 20 can store binary data having a number of bits equal to the number of regions.

In the case where the topological insulator 20 is used as a memory, information stored by the topological insulator 20 can be read if the direction of the magnetic field of each region can be detected. As described later, the potential difference between the edges of each region of the topological insulator 20 varies according to the direction of the magnetic field of each region. Thus, information stored by the topological insulator 20 can be read by detecting the potential difference between the edges of each region of the topological insulator 20.

As described above, the energy dissipation in electrical conduction along the edges of the topological insulator 20 is substantially zero. Thus, power consumption for processing information stored by the topological insulator 20 can be significantly reduced. Also, since the topological insulator 20 itself generates magnetic fields, non-volatile information is retained when an external magnetic field is not applied. By using the topological insulator 20 including a plurality of regions having different coercivities in this manner, power consumption in an electronic device such as a memory can be significantly reduced.

The topological insulator 20 may have a composition in which an element to provide magnetism is added to the topological insulator. For example, the element to provide magnetism is any of Ti, V, Cr, Mn, Fe, Co, Ni and Cu.

In an example, the topological insulator 20 may be a material represented by the following Formula 1, or may be a material that is formed of a material represented by Formula 1 and a material not containing an element M and has a super-lattice structure, and Formula 1: $M_z(Bi_{2-x}Sb_x)_{1-z}(Te_{3-3}Se_y)$, wherein M is any of Ti, V, Cr, Mn, Fe, Co, Ni and Cu, and 0<x<2, 0<y<3 and 0<z<1.

The topological insulator 20 may also be a material represented by the following Formula 2, or may be a material that is formed of a material represented by Formula 2 and a material not containing an element M and has a super-lattice structure, and Formula 2: $TIM_zM'_{1-z}X_2$, wherein M is any of Ti, V, Cr, Mn, Fe, Co, Ni and Cu, M' is Bi or Sb, X is S or Se, and 0<z<1.

The topological insulator 20 may also be a material represented by the following Formula 3, or may be a material that is formed of a material represented by Formula 3 and a material not containing an element M and has a super-lattice structure, and Formula 3: $M_zPb_{1-z}(Bi_{1-x}Sb_x)_2Te_4$, wherein M is any of Ti, V, Cr, Mn, Fe, Co, Ni and Cu, and 0<x<1 and 0<z<1.

The topological insulator 20 may also be a material represented by the following Formula 4, or may be a material that is formed of a material represented by Formula 4 and a material not containing an element M and has a super-lattice structure, and Formula 4: $(M_z(Ge_xPb_{1-x})_{1-z}Te)_n(M_y(Bi_aSb_{1-1})_{2-y}Te_3)_m$, wherein M is any of Ti, V, Cr, Mn, Fe, Co, Ni and Cu, 0<x<1, 0<a<1, 0<y<2 and 0<z<1, and n and m are any integers.

Also, the second region 22 can be formed by irradiating a partial region of the surface of the topological insulator having the first coercivity with predetermined ions. By irradiating the surface of the topological insulator with ions, damage can be applied to the region of the topological insulator to vary the coercivity. For example, the ions include argon ions and the like, but are not limited to argon ions. For example, ions of Group 18 elements other than argon may be used. Elements other than these elements can also be used as long as the coercivity of the topological insulator can be varied.

Figure 2:
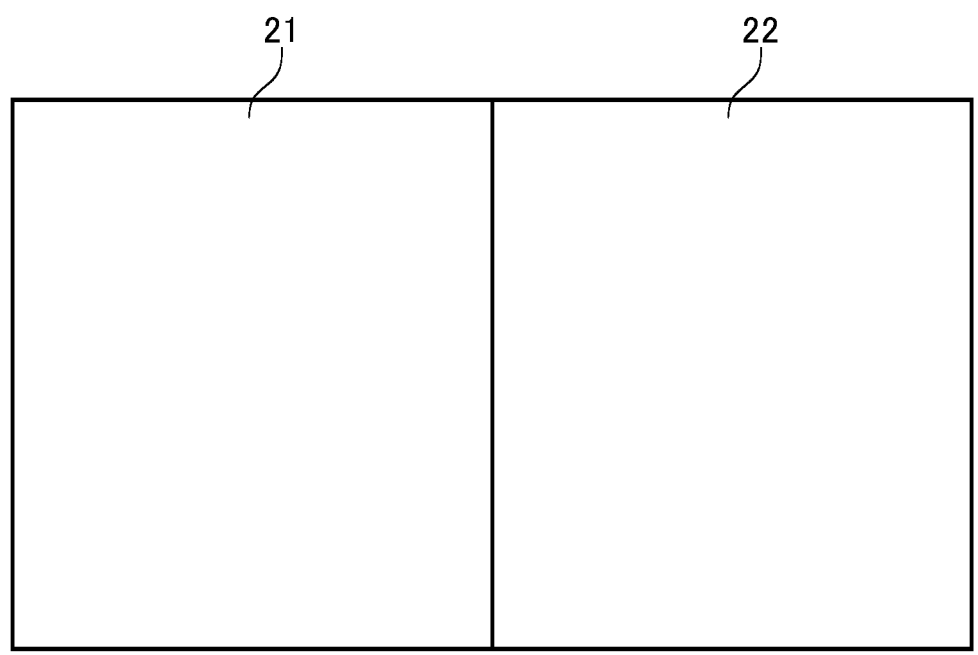
FIG. 2 is a schematic view showing a surface of the topological insulator 20.

FIG. 2 is a schematic view showing a surface of the topological insulator 20. As described above, the first region 21 and the second region 22 having different coercivities are both exposed on the surface of the topological insulator 20. Also, the first region 21 and the second region 22 may be adjacent to each other on the surface of the topological insulator 20.

Figure 3:
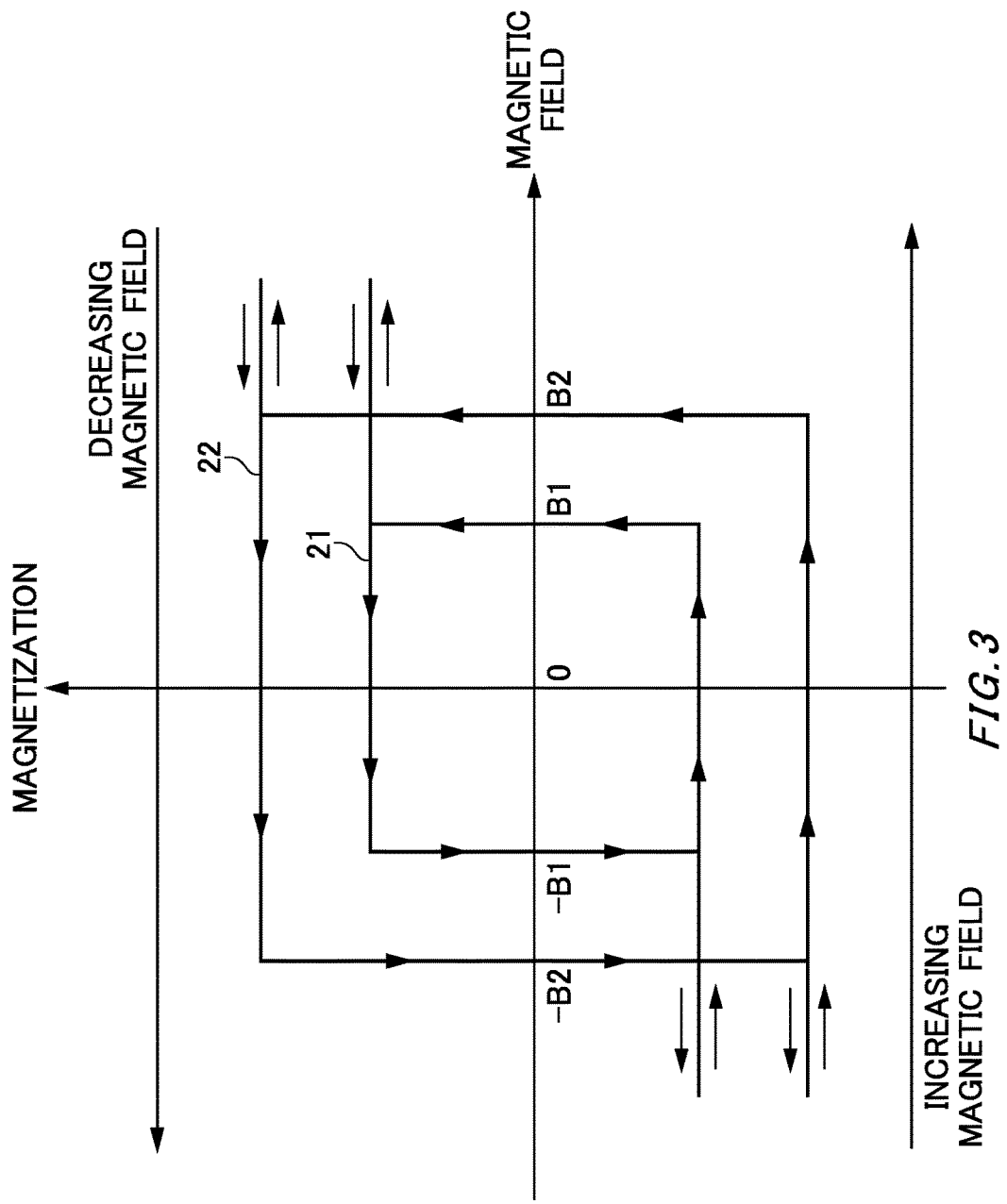
FIG. 3 is a schematic view of the magnetization curves of a first region 21 and a second region 22.

FIG. 3 is a schematic view of the magnetization curves of the first region 21 and the second region 22. In FIG. 3, the direction from the substrate 10 toward the topological insulator 20 is regarded as the positive direction of magnetization and magnetic field, and the direction from the topological insulator 20 toward the substrate 10 is regarded as the negative direction of magnetization and magnetic field.

The first region 21 and the second region 22 have different coercivities as described above, and therefore, in the process of increasing or decreasing an external magnetic field, the direction of magnetization is reversed at different magnitudes of the external magnetic field. In the present example, the direction of magnetization of the first region 21 changes to the same direction as that of the external magnetic field at the magnetic field B1 in the process of increasing the external magnetic field. The direction of magnetization of the second region 22 changes to the same direction as that of the external magnetic field at the magnetic field B2 that is larger than the magnetic field B1 in the process of increasing the external magnetic field.

Also, the direction of magnetization of the first region 21 changes to the same direction as that of the external magnetic field at the magnetic field −B1 in the process of decreasing the external magnetic field. The direction of magnetization of the second region 22 changes to the same direction as that of the external magnetic field at the magnetic field −B2 that is larger in absolute value than the magnetic field −B1 in the process of decreasing the external magnetic field.

Figure 4:
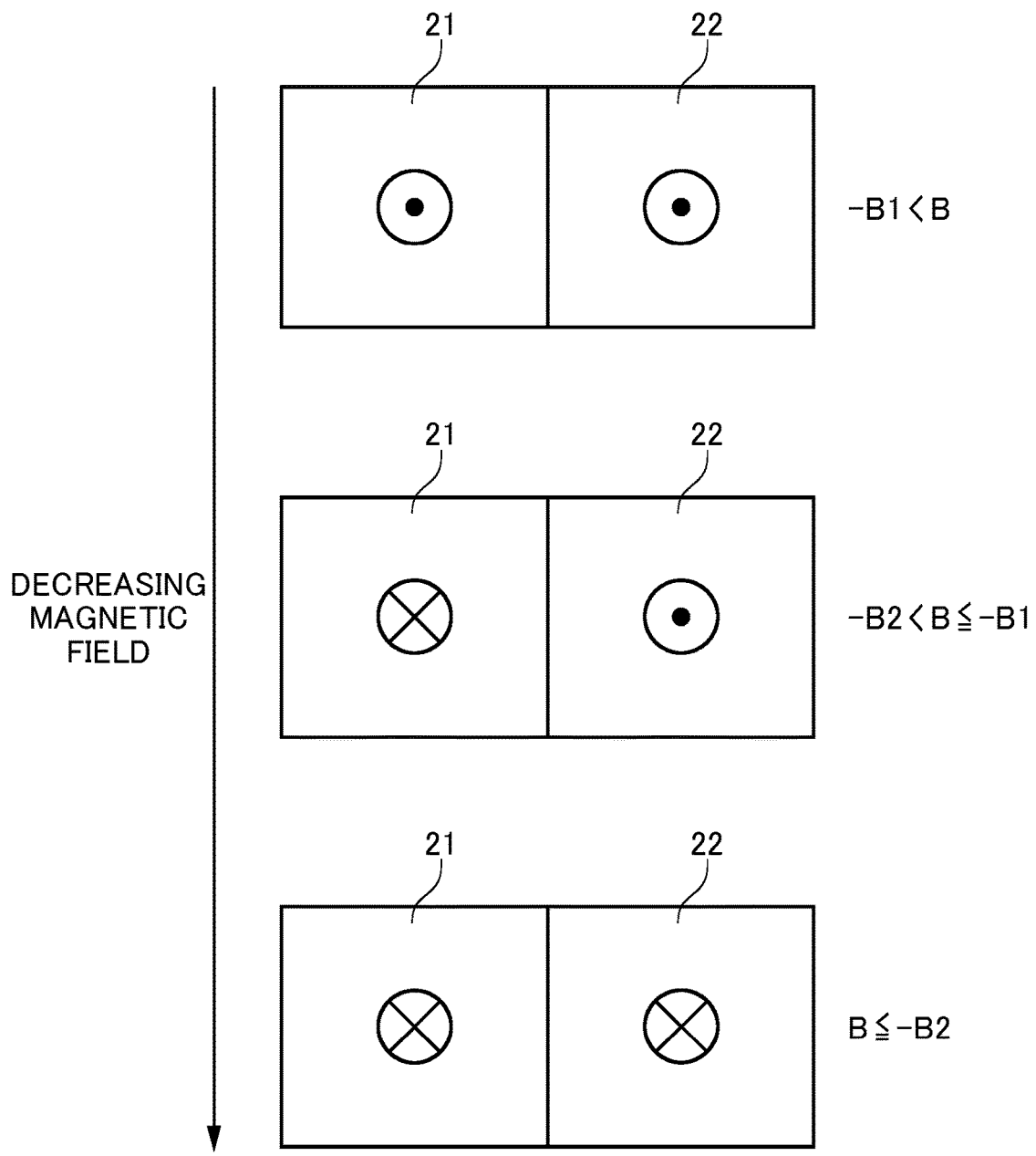
FIG. 4 is a schematic view showing changes in the directions of magnetization of the first region 21 and the second region 22 realized by decreasing the external magnetic field.

FIG. 4 is a schematic view showing changes in the directions of magnetization of the first region 21 and the second region 22 in the process of decreasing the external magnetic field. In FIG. 4, a circle with a dot at its center indicates magnetization in the positive direction, and a circle with crossing lines inside it indicates magnetization in the negative direction. Also, in the example of FIG. 4, the first region 21 and the second region 22 are both magnetized in the positive direction in their initial state.

As the external magnetic field is decreased from the initial state, the directions of magnetization of the first region 21 and the second region 22 do not change when the external magnetic field B is larger than −B1. As the external magnetic field is further decreased, the direction of magnetization of the first region 21 having a relatively weak coercivity is reversed when the external magnetic field B is larger than −B2 and smaller than or equal to −B1. As the external magnetic field is further decreased, the direction of magnetization of the second region 22 is also reversed when the external magnetic field B is smaller than or equal to −B2. Note that the directions of magnetization of the first region 21 and the second region 22 are preserved even when the external magnetic field is turned off.

Figure 5:
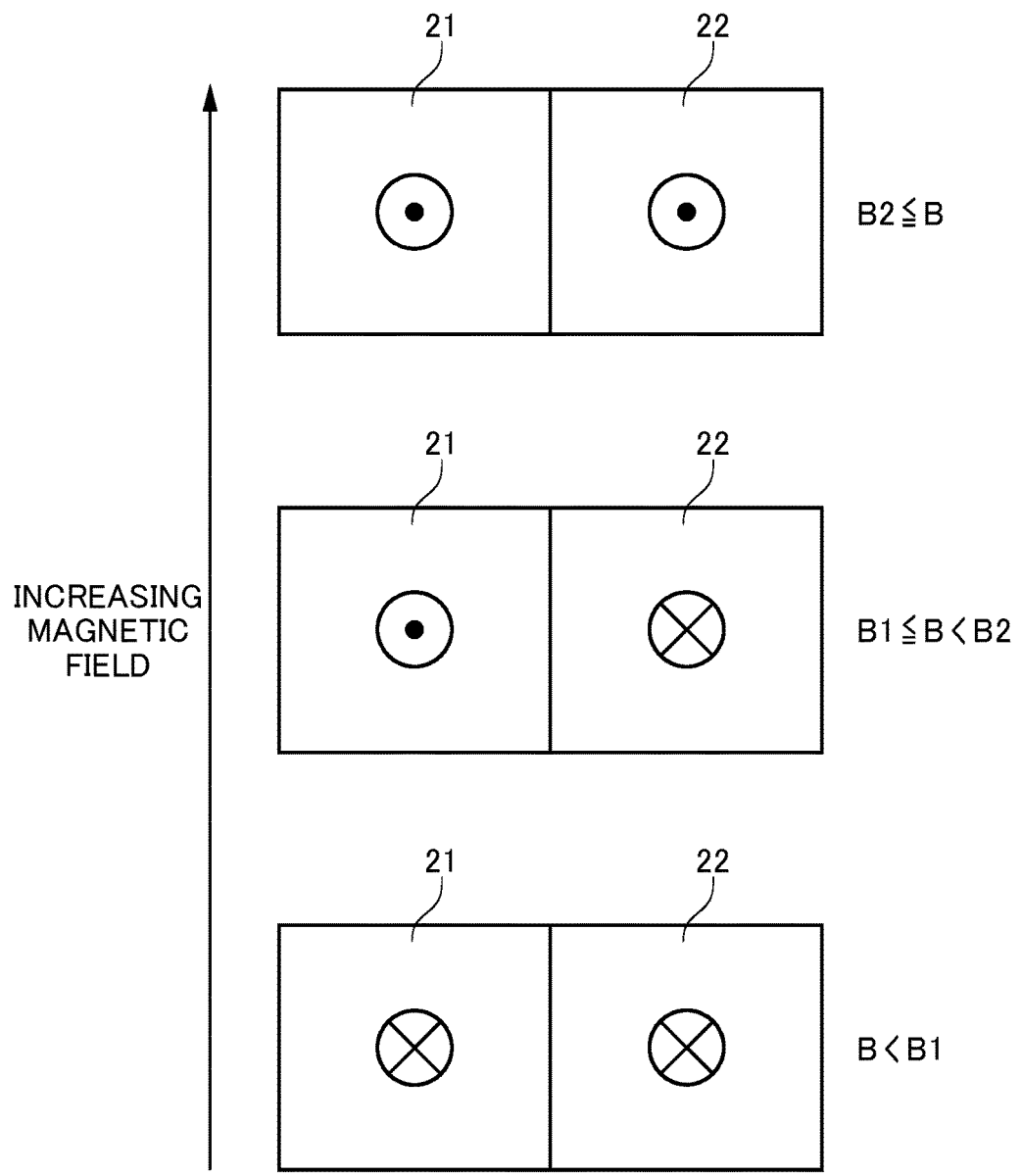
FIG. 5 is a schematic view showing changes in the directions of magnetization of the first region 21 and the second region 22 realized by increasing the external magnetic field.

FIG. 5 is a schematic view showing changes in the directions of magnetization of the first region 21 and the second region 22 in the process of increasing the external magnetic field. In the example of FIG. 5, the first region 21 and the second region 22 are both magnetized in the negative direction in their initial state.

As the external magnetic field is increased from the initial state, the directions of magnetization of the first region 21 and the second region 22 do not change when the external magnetic field B is smaller than B1. As the external magnetic field is further increased, the direction of magnetization of the first region 21 having a relatively weak coercivity is reversed when the external magnetic field B is larger than or equal to B1 and smaller than B2. As the external magnetic field is further increased, the direction of magnetization of the second region 22 is also reversed when the external magnetic field B is larger than or equal to B2. Note that the directions of magnetization of the first region 21 and the second region 22 are preserved even when the external magnetic field is turned off (that is, B=0).

As shown in FIGS. 4 and 5, the directions of magnetization of two regions having different coercivities can be controlled independently for each region by adjusting the external magnetic field. Thus, information can be stored in the topological insulator 20 by adjusting the external magnetic field.

Figure 6:
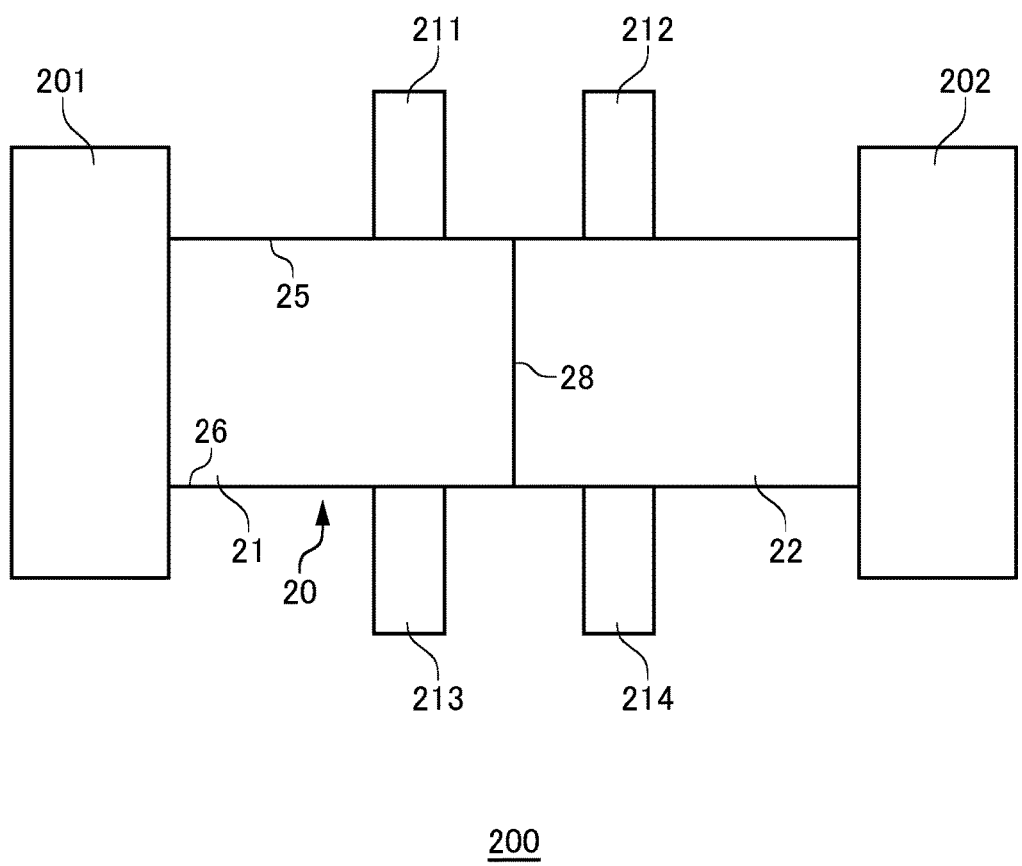
FIG. 6 is a schematic view showing a surface of an electronic device 200 using the topological insulator 20.

FIG. 6 is a schematic view showing a surface of an electronic device 200 using the topological insulator 20. The electronic device 200 includes the topological insulator 20, a first drive electrode 201, a second drive electrode 202, a first detection electrode 211, a second detection electrode 212, a third detection electrode 213 and a fourth detection electrode 214.

In the present example, the first drive electrode 201, the second drive electrode 202, the first detection electrode 211, the second detection electrode 212, the third detection electrode 213 and the fourth detection electrode 214 are provided on the surface of the substrate 10. The second drive electrode 202 is spaced apart from the first drive electrode 201 on the surface of the substrate 10.

The topological insulator 20 contacts both of the first drive electrode 201 and the second drive electrode 202. The topological insulator 20 in the present example is placed between the first drive electrode 201 and the second drive electrode 202.

The topological insulator 20 has a first edge 25 and a second edge 26, each of which is positioned between the first drive electrode 201 and the second drive electrode 202. In the present example, the topological insulator 20 has a thin-film shape, and the first edge 25 and the second edge 26 are opposing edges of a predetermined surface of the thin-film shape. In an example, the first edge 25 and the second edge 26 have the same length and extend in parallel with each other. The planar shape of the topological insulator 20 may be rectangular.

The first region 21 and the second region 22 having different coercivities are arranged in order in the direction from the first drive electrode 201 toward the second drive electrode 202. In the present example, the first drive electrode 201, the first region 21, the second region 22 and the second drive electrode 202 are arranged in this order.

The boundary 28 between the first region 21 and the second region 22 extends from the first edge 25 to the second edge 26. In the present example, the first edge 25 and the second edge 26 extend in parallel with each other, and the boundary 28 extends in the direction perpendicular to the first edge 25 and the second edge 26. The areas of the first region 21 and the second region 22 may be substantially the same, or may be different.

The first detection electrode 211 is electrically connected to the first region 21 at the first edge 25. The second detection electrode 212 is electrically connected to the second region 22 at the first edge 25. That is, the first detection electrode 211 and the second detection electrode 212 are placed on opposite sides of the boundary 28 on the first edge 25.

The third detection electrode 213 is electrically connected to the first region 21 at the second edge 26. The fourth detection electrode 214 is electrically connected to the second region 22 at the second edge 26. That is, the third detection electrode 213 and the fourth detection electrode 214 are placed on opposite sides of the boundary 28 on the second edge 26.

When a voltage is applied between the first drive electrode 201 and the second drive electrode 202, current flows in the surface of the topological insulator 20 between the first drive electrode 201 and the second drive electrode 202. At this time, the topological insulator 20 has generated magnetic fields perpendicular to its surface, and therefore conduction electrons flow along the first edge 25 and the second edge 26.

By detecting the potential difference between at least one pair of detection electrodes while current flows between the first drive electrode 201 and the second drive electrode 202, information about the magnetization directions of the first region 21 and the second region 22 can be acquired. As described above, the energy dissipation during electrical conduction in the surface of the topological insulator 20 is substantially zero even when current flows between the first drive electrode 201 and the second drive electrode 202, and therefore the current consumed in the electronic device 200 to acquire information about the magnetization directions of the first region 21 and the second region 22 can be made approximately zero.

Figure 7A:
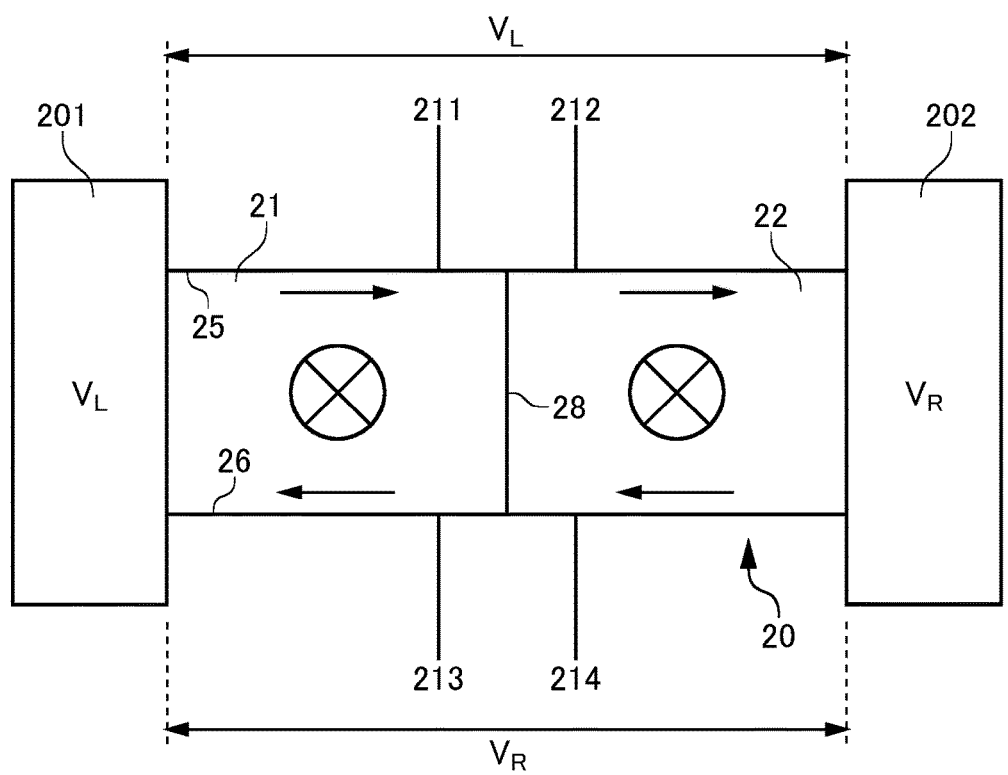
FIG. 7A illustrates the potential difference between respective detection electrodes when the magnetization directions of the first region 21 and the second region 22 are the negative direction.

FIG. 7A illustrates the potential difference between respective detection electrodes when the magnetization directions of the first region 21 and the second region 22 are both the negative direction. Note that a voltage applied to the first drive electrode 201 is referred to as $V_L$ and a voltage applied to the second drive electrode 202 is referred to as $V_R$. In FIG. 7A and so forth, each detection electrode is schematically shown as a straight line.

In the present example, current flows along the first edge 25 from the first drive electrode 201 toward the second drive electrode 202. The electrical conduction along the first edge 25 causes no energy dissipation, and therefore no voltage drop occurs along the first edge 25. In this case, the voltage of the entire first edge 25 is $V_L$, the same voltage as the first drive electrode 201.

Also, current flows along the second edge 26 from the second drive electrode 202 toward the first drive electrode 201. The electrical conduction along the second edge 26 causes no energy dissipation, and therefore no voltage drop occurs along the second edge 26. In this case, the voltage of the entire second edge 26 is $V_R$, the same voltage as the second drive electrode 202.

In this case, no potential difference is generated between the first detection electrode 211 and the second detection electrode 212. Similarly, no potential difference is generated between the third detection electrode 213 and the fourth detection electrode 214. Also, a potential difference of $V_L-V_R$ is generated between the first detection electrode 211 and the third detection electrode 213. Similarly, a potential difference of $V_L-V_R$ is also generated between the second detection electrode 212 and the fourth detection electrode 214. It can be determined, from some or all of the information about these potential differences between the detection electrodes, that the magnetization directions of the first region 21 and the second region 22 are both the negative direction. The potential difference between the first detection electrode 211 and the fourth detection electrode 214 and the potential difference between the second detection electrode 212 and the third detection electrode 213 may also be used.

Figure 7B:
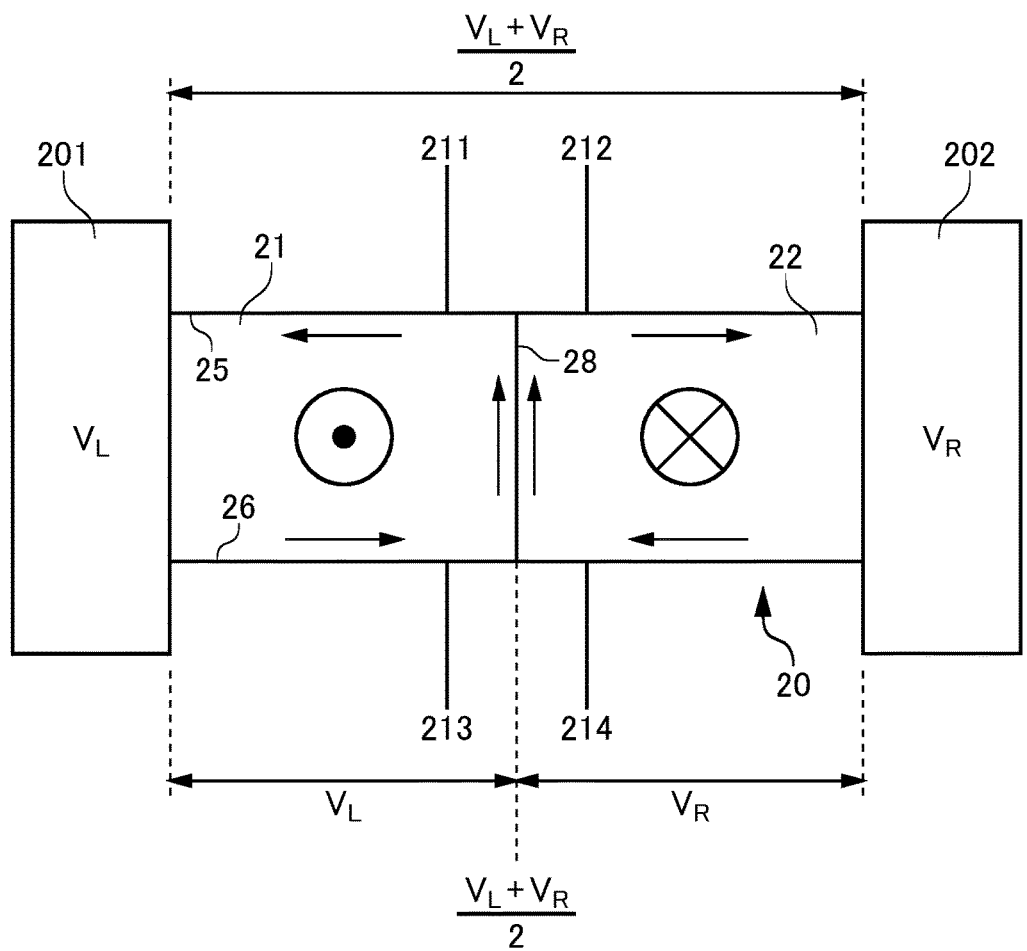
FIG. 7B illustrates the potential difference between respective detection electrodes when the magnetization direction of the first region 21 is the positive direction and the magnetization direction of the second region 22 is the negative direction.

FIG. 7B illustrates the potential difference between respective detection electrodes when the magnetization direction of the first region 21 is the positive direction and the magnetization direction of the second region 22 is the negative direction. In the present example, current in the first region 21 passes through the first drive electrode 201, the second edge 26, the boundary 28, the first edge 25 and the first drive electrode 201 in this order. Also, current in the second region 22 passes through the second drive electrode 202, the second edge 26, the boundary 28, the first edge 25 and the second drive electrode 202 in this order.

In this case, the voltage of a portion of the second edge 26 corresponding to the first region 21 is $V_L$, the same voltage as the first drive electrode 201. Also, the voltage of a portion of the second edge 26 corresponding to the second region 22 is $V_R$, the same voltage as the second drive electrode 202. Also, the voltage of the boundary 28 is $(V_L+V_R)/2$, which is the average voltage of the voltage $V_L$ of the first drive electrode 201 and the voltage $V_R$ of the second drive electrode 202. The voltage of the entire first edge 25 is also $(V_L+V_R)/2$ in a similar manner to the boundary 28.

In the present example, no potential difference is generated between the first detection electrode 211 and the second detection electrode 212, but a potential difference of $V_L-V_R$ is generated between the third detection electrode 213 and the fourth detection electrode 214. Also, a potential difference of $(V_R-V_L)/2$ is generated between the first detection electrode 211 and the third detection electrode 213. Similarly, a potential difference of $(V_R-V_L)/2$ is also generated between the second detection electrode 212 and the fourth detection electrode 214. The potential difference between the first detection electrode 211 and the fourth detection electrode 214 and the potential difference between the second detection electrode 212 and the third detection electrode 213 may also be used. It can be determined, from some or all of the information about these potential differences between the detection electrodes, that the magnetization direction of the first region 21 is the positive direction and the magnetization direction of the second region 22 is the negative direction.

Similarly, it is also possible to determine when the magnetization direction of the first region 21 is the negative direction and the magnetization direction of the second region 22 is the positive direction, from information about the potential differences between the detection electrodes. Note that, in this case, the voltage of the second edge 26 in the first region 21 is $V_R$ while the voltage of the second edge 26 in the second region 22 is $V_L$. Other voltages are similar to those in the example of FIG. 7B.

Figure 7C:
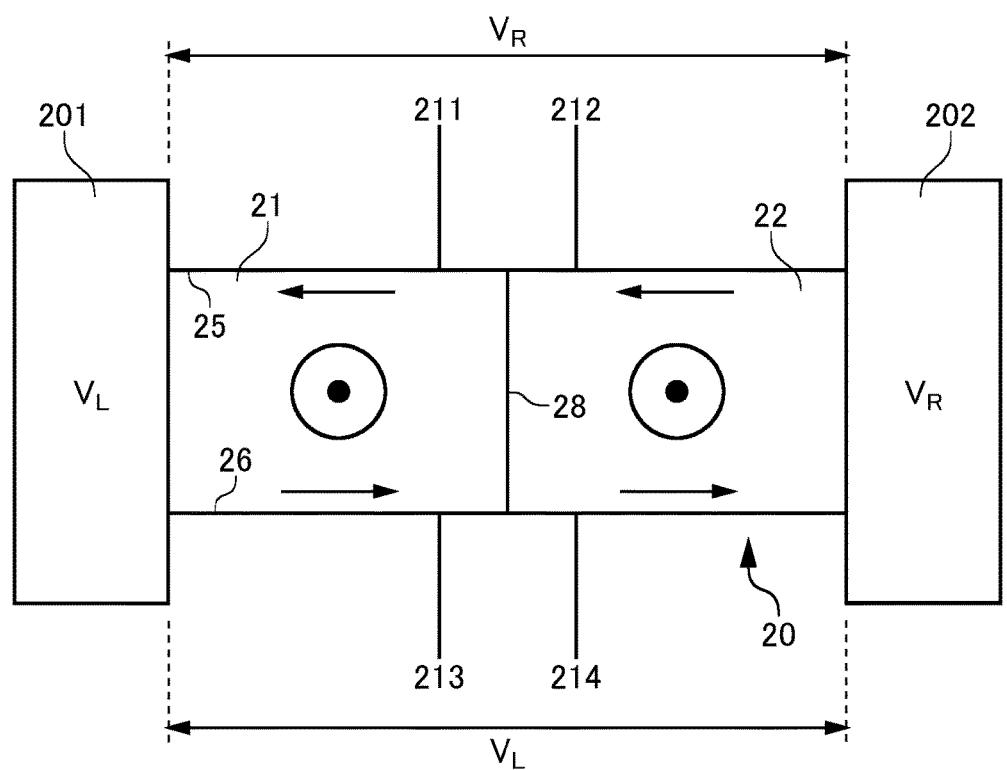
FIG. 7C illustrates the potential difference between respective detection electrodes when the magnetization directions of the first region 21 and the second region 22 are the positive direction.

FIG. 7C illustrates the potential difference between respective detection electrodes when the magnetization directions of the first region 21 and the second region 22 are both the positive direction. In the present example, current flows along the first edge 25 from the second drive electrode 202 toward the first drive electrode 201. In this case, the voltage of the entire first edge 25 is $V_R$, the same voltage as the second drive electrode 202.

Also, current flows along the second edge 26 from the first drive electrode 201 toward the second drive electrode 202. In this case, the voltage of the entire second edge 26 is $V_L$, the same voltage as the first drive electrode 201.

In this case, no potential difference is generated between the first detection electrode 211 and the second detection electrode 212. Similarly, no potential difference is generated between the third detection electrode 213 and the fourth detection electrode 214. Also, a potential difference of $V_R-V_L$ is generated between the first detection electrode 211 and the third detection electrode 213. The potential difference has the opposite sign of the potential difference in the example of FIG. 7A. Similarly, a potential difference of $V_R-V_L$ is also generated between the second detection electrode 212 and the fourth detection electrode 214. The potential difference between the first detection electrode 211 and the fourth detection electrode 214 and the potential difference between the second detection electrode 212 and the third detection electrode 213 may also be used. It can be determined, from some or all of the information about these potential differences between the detection electrodes, that the magnetization directions of the first region 21 and the second region 22 are both the positive direction.

Figure 8:
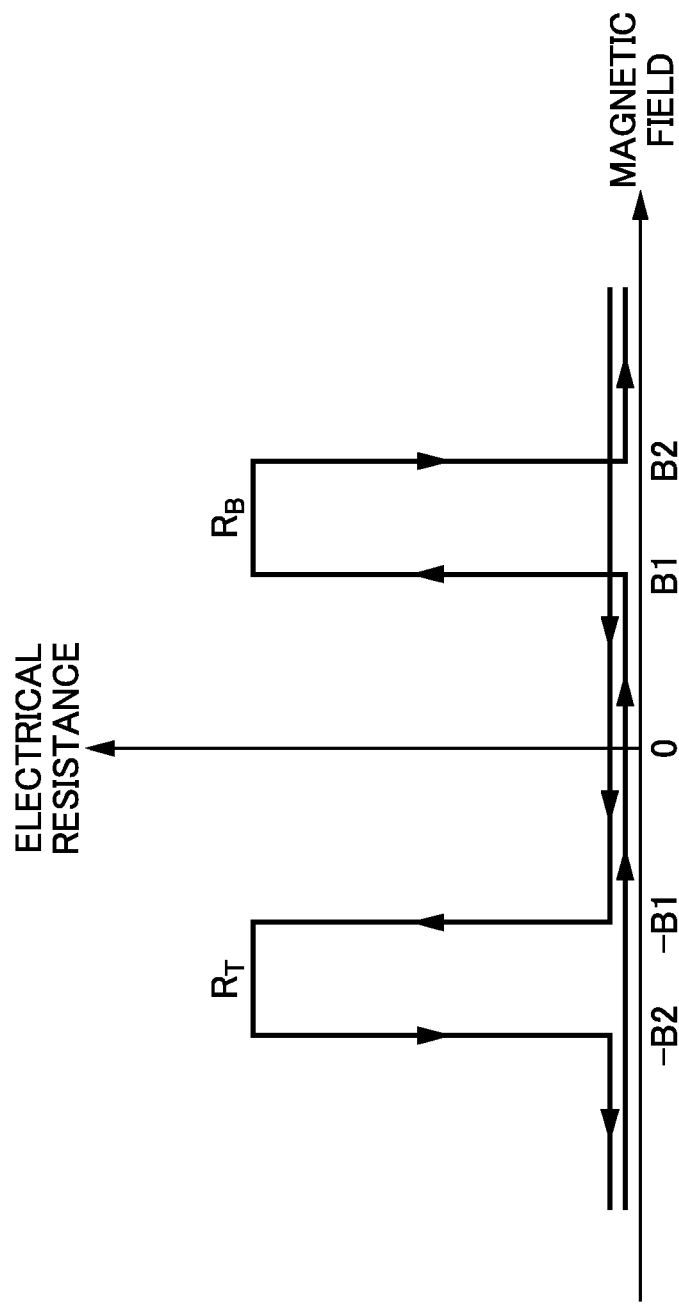
FIG. 8 shows the potential difference between a first detection electrode 211 and a second detection electrode 212 and the potential difference between a third detection electrode 213 and a fourth detection electrode 214 when the external magnetic field is increased and decreased, represented as electrical resistances.

FIG. 8 shows the potential difference between the first detection electrode 211 and the second detection electrode 212 and the potential difference between the third detection electrode 213 and the fourth detection electrode 214 when the external magnetic field is increased and decreased, represented as electrical resistances. The potential difference between the first detection electrode 211 and the second detection electrode 212 is indicated by a resistance $R_T$, and the potential difference between the third detection electrode 213 and the fourth detection electrode 214 is indicated by a resistance $R_B$. The product of each electrical resistance and the current that flows therethrough is equivalent to the potential difference between detection electrodes. Note that each electrical resistance merely represents a potential difference rather than indicating the actual electrical resistance. No energy dissipation is caused along the first edge 25 and the second edge 26, and therefore the actual power consumption is zero.

As described with reference to FIGS. 7A to 7C, the resistance $R_T$ or the resistance $R_B$ is non-zero when the magnetization directions of the first region 21 and the second region 22 are different from each other. That is, as described with reference to FIGS. 4 and 5, the resistance $R_B$ takes non-zero values when the external magnetic field B is larger than or equal to B1 and smaller than B2 in the process of increasing the external magnetic field. Also, the resistance $R_T$ takes non-zero values when the external magnetic field B is larger than −B2 and smaller than or equal to −B1 in the process of decreasing the external magnetic field.

Figure 9A:
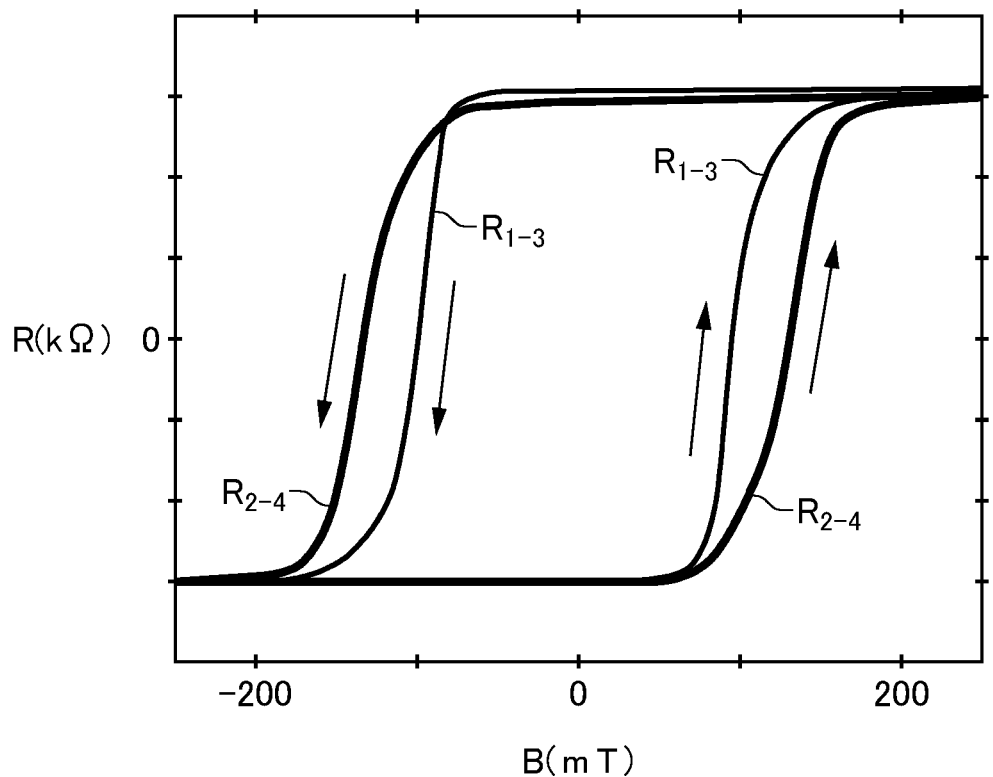
FIG. 9A shows a measurement result of an electrical resistance R when the external magnetic field B applied to the electronic device 200 is varied.
Figure 9B:
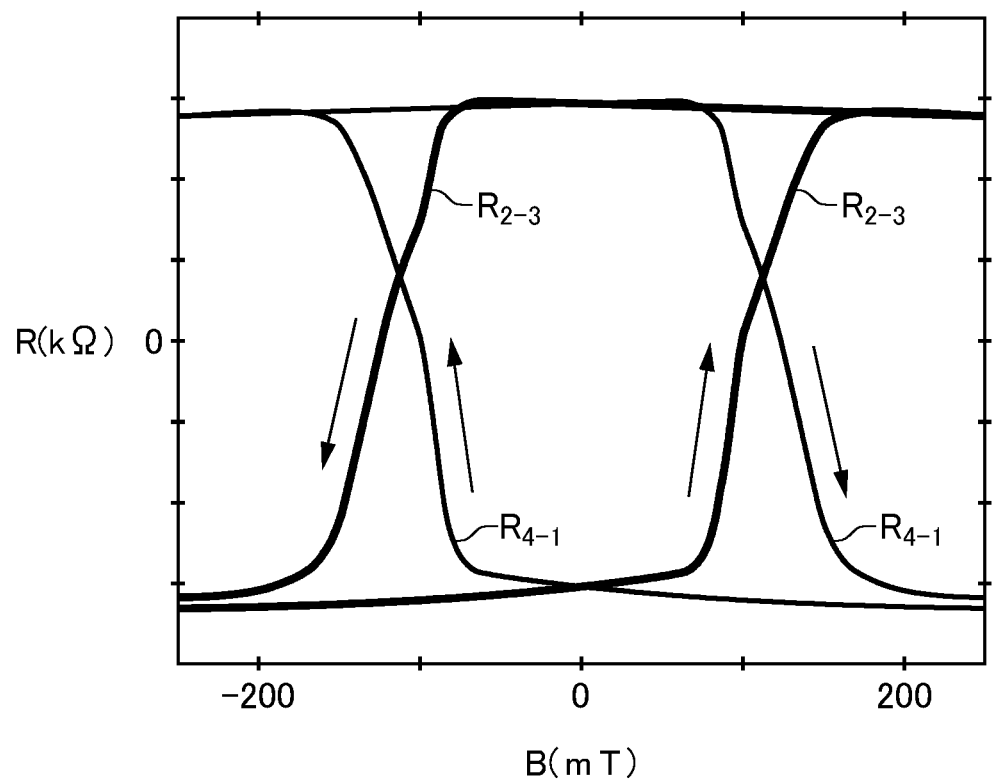
FIG. 9B shows a measurement result of the electrical resistance R when the external magnetic field B applied to the electronic device 200 is varied.
Figure 9C:
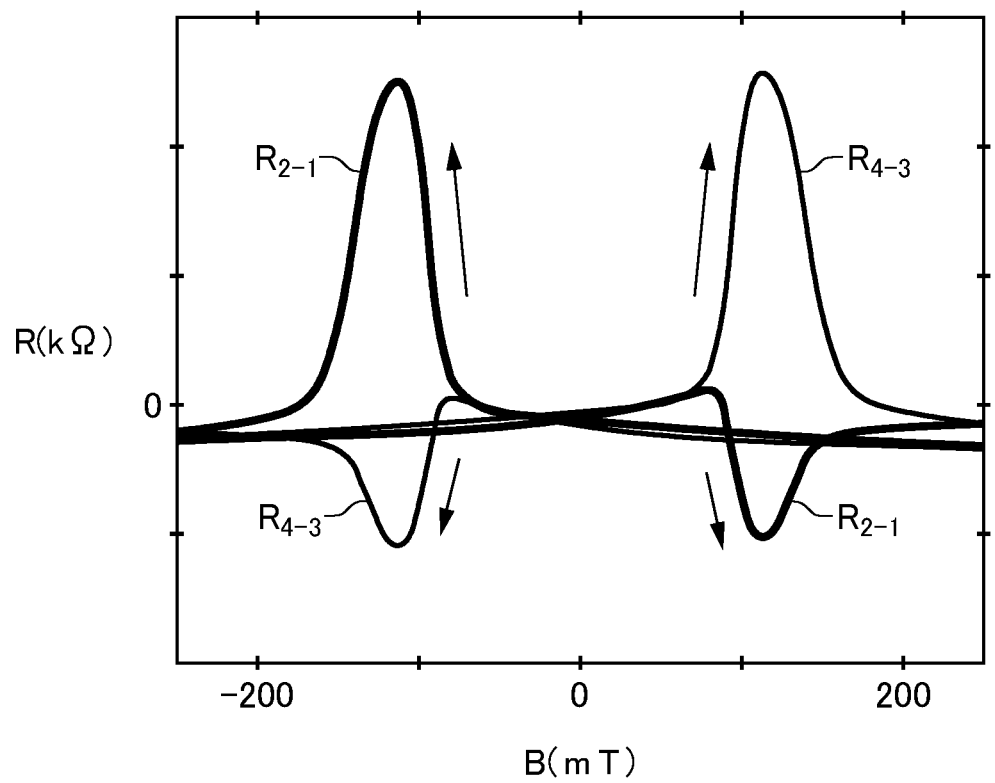
FIG. 9C shows a measurement result of the electrical resistance R when the external magnetic field B applied to the electronic device 200 is varied.

FIGS. 9A, 9B and 9C show measurement results of the electrical resistance R when the external magnetic field B applied to the electronic device 200 is varied. In the present example, the substrate 10 is an InP substrate, and the composition of the topological insulator 20 is $Cr_{0.2}(Bi_{0.22}Sb_{0.78})_{1.8}Te_3$. Also, the thickness of the topological insulator 20 is set to 8 nm. The topological insulator 20 is formed on the substrate 10, and then it is arranged in a vacuum chamber. The degree of vacuum in the vacuum chamber is $3\times10^{-4}$ Pa or less.

A partial region of the surface of the topological insulator 20 in the vacuum chamber is irradiated with argon ions. The accelerating voltage of argon ions is 800 V, the amount of current supplied to an ion gun to generate argon ions is 30 mA, the irradiation angle of argon ions relative to the surface of the topological insulator 20 is 45 degrees, and the irradiation time with argon ions is 1 second.

FIG. 9A shows a resistance $R_{1-3}$ according to the potential difference between the first detection electrode 211 and the third detection electrode 213, and a resistance $R_{2-4}$ according to the potential difference between the second detection electrode 212 and the fourth detection electrode 214. The waveform of the resistance $R_{1-3}$ corresponds to the magnetization curve of the first region 21. Also, the waveform of the resistance $R_{2-4}$ corresponds to the magnetization curve of the second region 22. As shown in FIG. 9A, it can be seen that the coercivity difference between the first region 21 and the second region 22 occurs due to the irradiation with argon ions.

FIG. 9B shows a resistance $R_{2-3}$ according to the potential difference between the second detection electrode 212 and the third detection electrode 213, and a resistance $R_{4-1}$ according to the potential difference between the fourth detection electrode 214 and the first detection electrode 211. It can also be seen from FIG. 9B that the coercivity varies between the first region 21 and the second region 22 due to the irradiation with argon ions.

FIG. 9C shows a resistance $R_{2-1}$ according to the potential difference between the second detection electrode 212 and the first detection electrode 211, and a resistance $R_{4-3}$ according to the potential difference between the fourth detection electrode 214 and the third detection electrode 213. The resistance $R_{4-3}$ corresponds to the resistance $R_B$ shown in FIG. 8, and the resistance $R_{2-1}$ corresponds to the resistance $R_T$ shown in FIG. 8. It can also be seen from FIG. 9C that the coercivity varies between the first region 21 and the second region 22 due to the irradiation with argon ions. Also, as shown in FIGS. 9A-C, it can be seen that the magnetization directions of the first region 21 and the second region 22 can be detected based on the respective resistances. Note that, in FIGS. 9A, 9B and 9C, surplus resistances that are not related to the quantum electrical conduction are subtracted. The surplus resistances include, for example, the contact resistance between each electrode and the topological insulator 20, and the like.

Figure 10A:
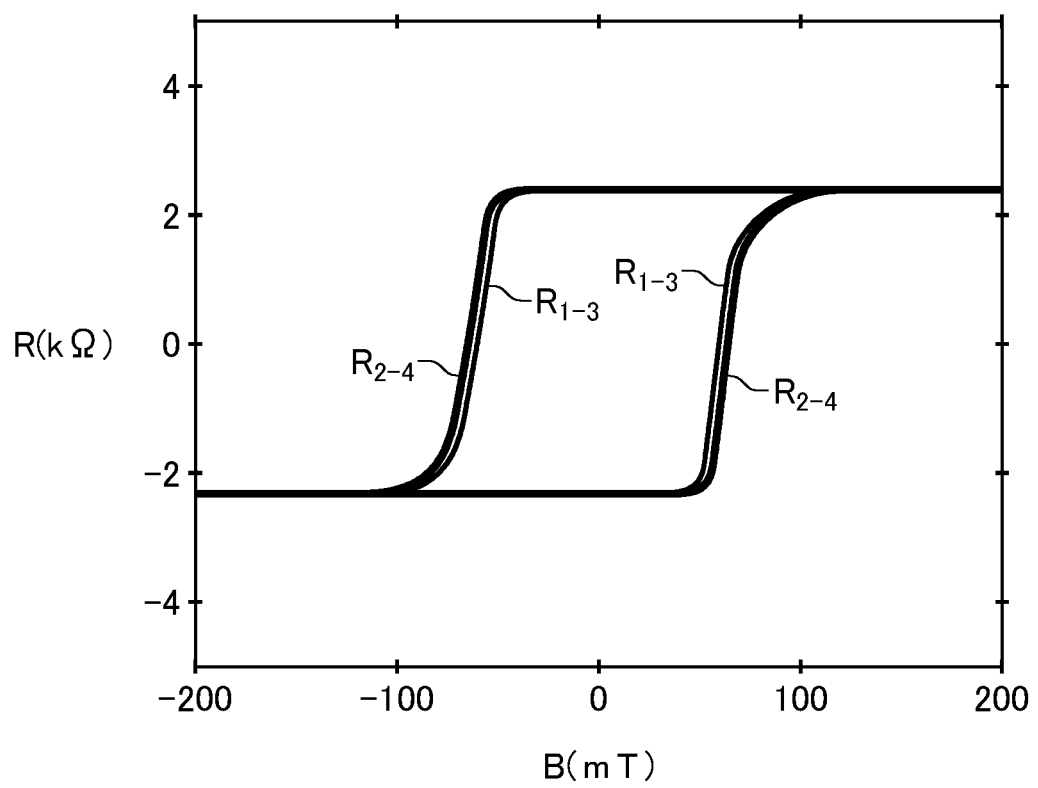
FIG. 10A shows variation in the coercivity of the second region 22 when the accelerating voltage of argon ions is varied.
Figure 10B:
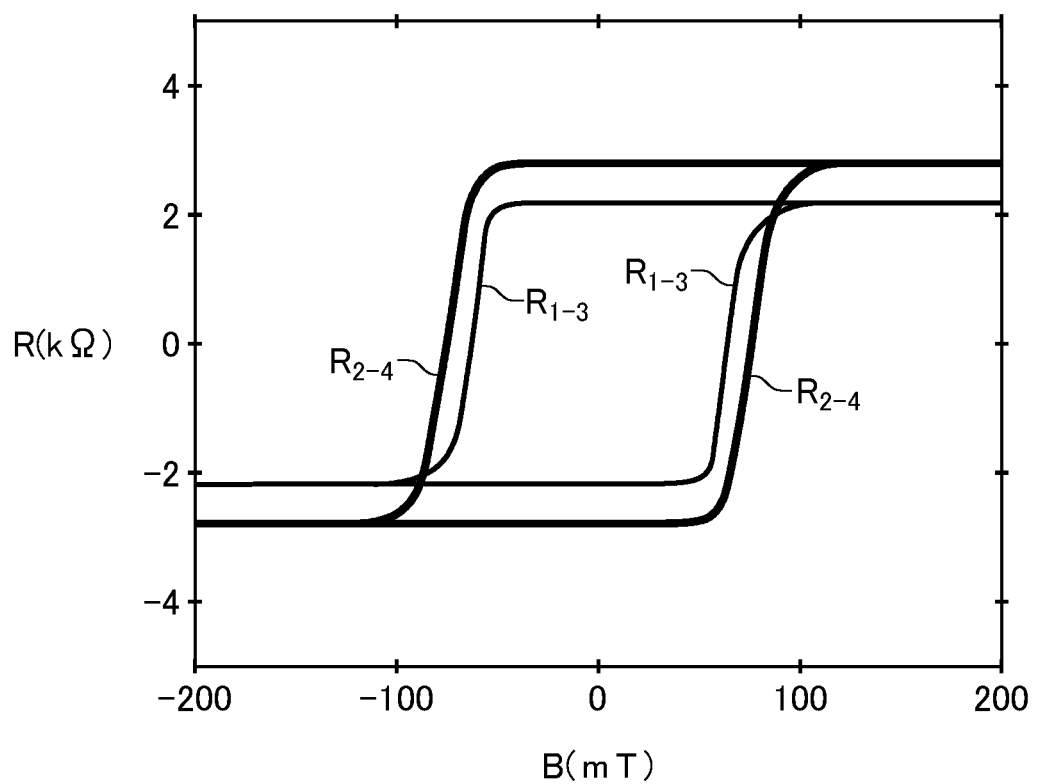
FIG. 10B shows variation in the coercivity of the second region 22 when the accelerating voltage of argon ions is varied.
Figure 10C:
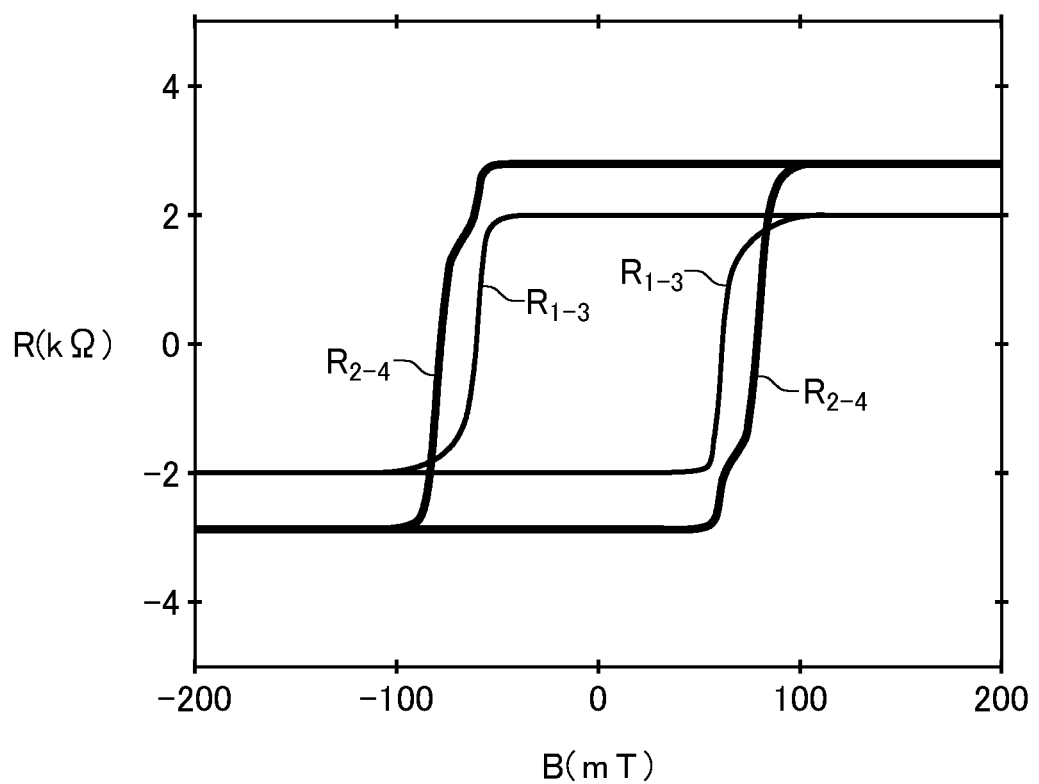
FIG. 10C shows variation in the coercivity of the second region 22 when the accelerating voltage of argon ions is varied.

FIGS. 10A, 10B and 10C show variation in the coercivity of the second region 22 when the accelerating voltage of argon ions is varied. Note that the irradiation time with argon ions is set to 5 seconds. Other conditions are the same as in the examples of FIGS. 9A to 9C. Also, in FIGS. 10A, 10B and 10C, the magnetization curve of the first region 21 is indicated by the resistance $R_{1-3}$, and the magnetization curve of the second region 22 is indicated by the resistance $R_{2-4}$.

FIG. 10A shows the case where the accelerating voltage of argon ions is set to 300 V. In this case, the coercivity of the second region 22 does not significantly vary from the coercivity of the first region 21. FIG. 10B shows the case where the accelerating voltage of argon ions is set to 400 V. It can be seen that the coercivity of the second region 22 is larger than the coercivity of the first region 21. FIG. 10C shows the case where the accelerating voltage of argon ions is set to 500 V. It can be seen that the coercivity of the second region 22 is further increased.

In this manner, the coercivity of the second region 22 can be controlled according to the accelerating voltage of argon ions. If the difference between the coercivities of the first region 21 and the second region 22 is too small, it is difficult to control the magnetization directions of the first region 21 and the second region 22 independently with an external magnetic field. However, it can be seen that the difference between the coercivities can be made sufficiently large by adjusting the accelerating voltage of argon ions.

Figure 11A:
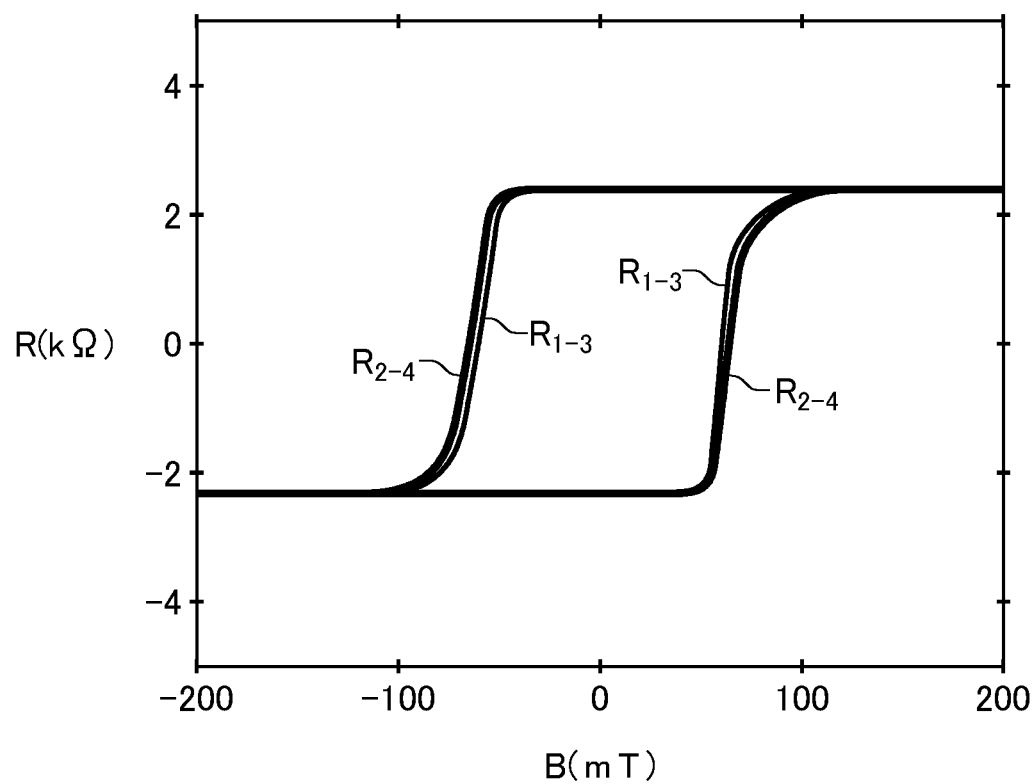
FIG. 11A shows variation in the coercivity of the second region 22 when the irradiation time with argon ions is varied.
Figure 11B:
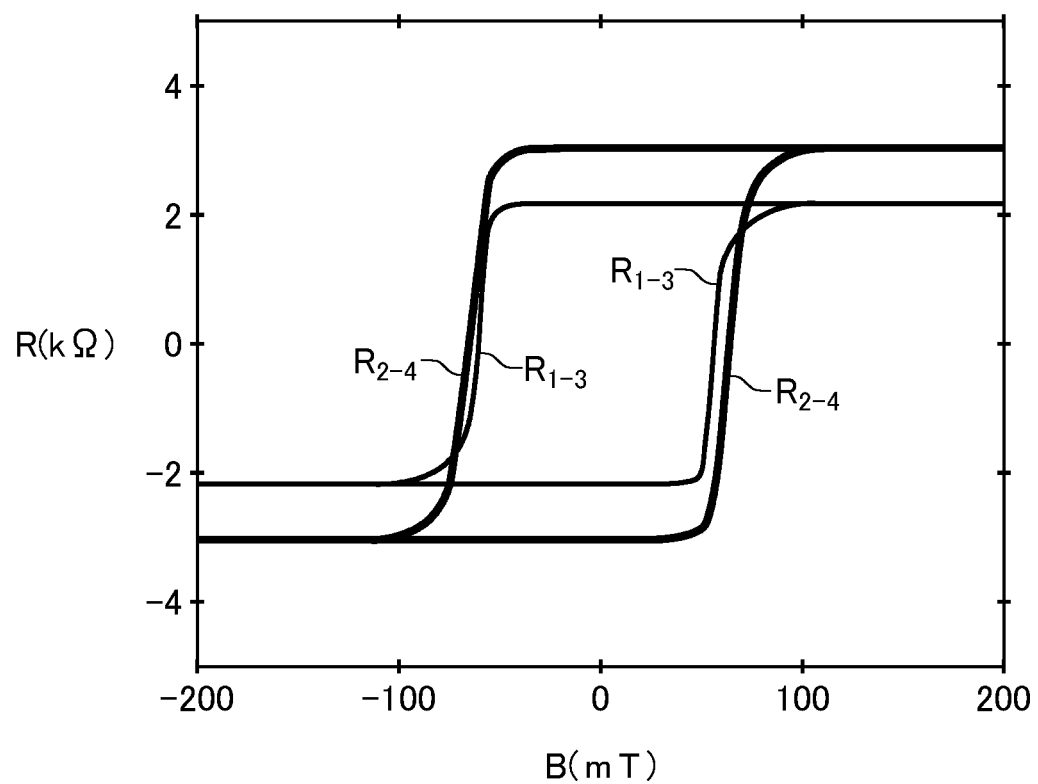
FIG. 11B shows variation in the coercivity of the second region 22 when the irradiation time with argon ions is varied.
Figure 11C:
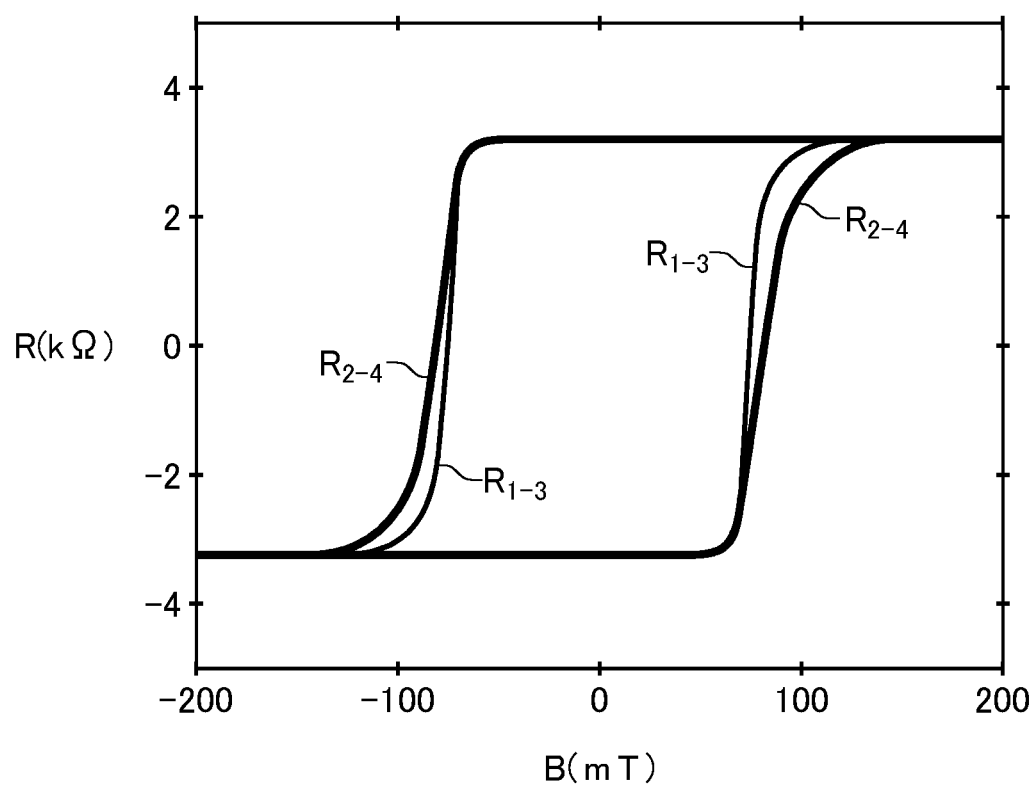
FIG. 11C shows variation in the coercivity of the second region 22 when the irradiation time with argon ions is varied.

FIGS. 11A, 11B and 11C show variation in the coercivity of the second region 22 when the irradiation time with argon ions is varied. Note that the accelerating voltage of argon ions is set to 300 V. Other conditions are the same as in the examples of FIGS. 9A to 9C.

FIG. 11A shows the case where the irradiation time with argon ions is set to 5 seconds. That is, it is the same condition as in the case of FIG. 10A. In this case, the coercivity of the second region 22 does not significantly vary from the coercivity of the first region 21. FIG. 11B shows the case where the irradiation time with argon ions is set to 7 seconds. The coercivity of the second region 22 is not significantly changed even though the irradiation time is increased. FIG. 11C shows the case where the irradiation time with argon ions is set to 9 seconds. It can be seen that the coercivity of the second region 22 is not significantly changed even though the irradiation time is further increased.

In this manner, the coercivity of the second region 22 is not significantly changed due to the irradiation time with argon ions. Thus, the irradiation time with argon ions may be shortened, as long as the coercivity of the second region 22 is changed. The irradiation time with argon ions may be 5 seconds or less, or may be 1 second or less.

Figure 12:
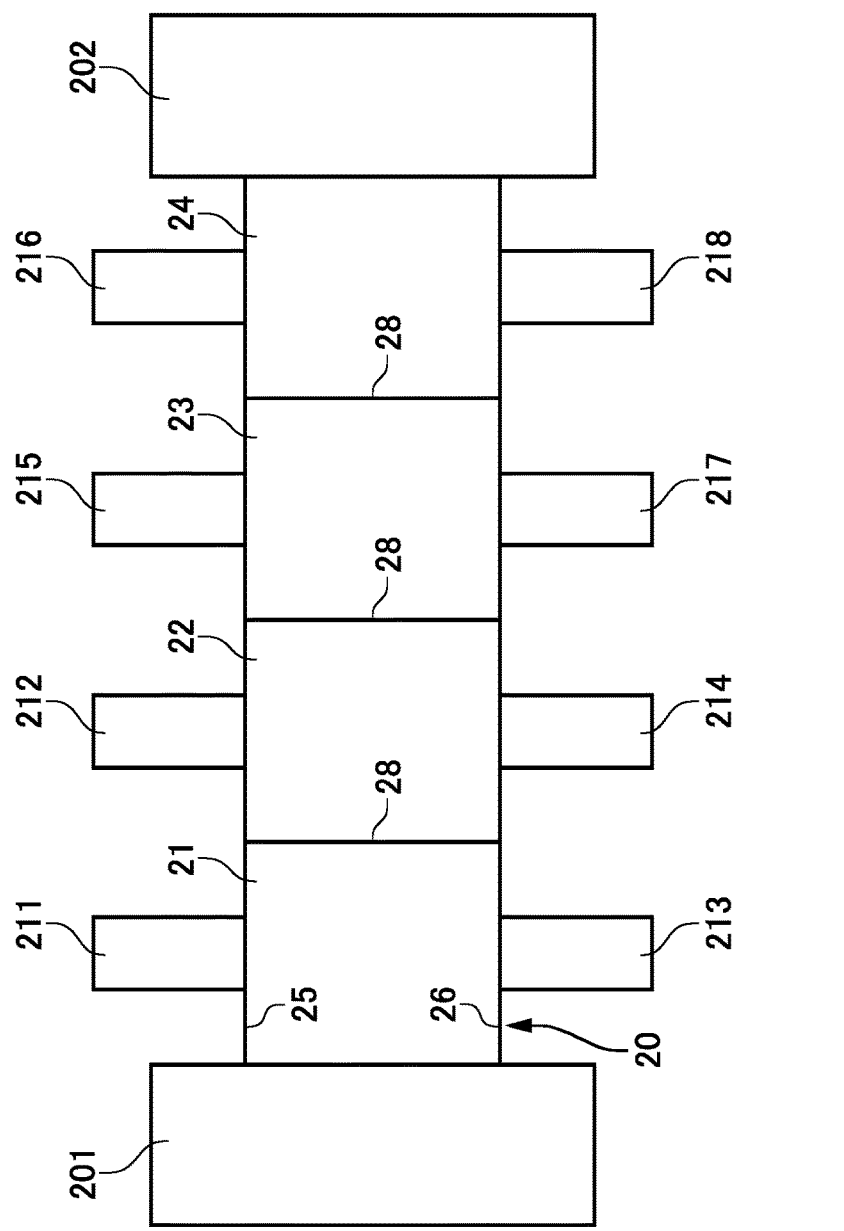
FIG. 12 is a schematic view showing another example of the surface structure of the electronic device 200.

FIG. 12 is a schematic view showing another example of the surface structure of the electronic device 200. The topological insulator 20 in the present example has a first region 21, a second region 22, a third region 23 and a fourth region 24. The number of regions may also be three, or may be five or more. The plurality of regions are arranged in order between the first drive electrode 201 and the second drive electrode 202. Detection electrodes (a first detection electrode 211, a second detection electrode 212, a third detection electrode 213, a fourth detection electrode 214, a fifth detection electrode 215, a sixth detection electrode 216, a seventh detection electrode 217 and an eighth detection electrode 218, in the present example) are connected to the first edge 25 and the second edge of respective regions.

The plurality of regions may be arranged in order of the magnitude of coercivity between the first drive electrode 201 and the second drive electrode 202. With such a configuration, the position of the boundary 28 between regions in which the magnetization direction is reversed can be controlled by an external magnetic field. For example, information can be stored in the electronic device 200 based on the position of the boundary 28.

Also, regions having the first coercivity and regions having the second coercivity may be arranged alternately between the first drive electrode 201 and the second drive electrode 202. For example, the third region 23 has the same coercivity as the first region 21, and the fourth region 24 has the same coercivity as the second region 22. That is, a plurality of sets of the arrangement of regions shown in FIG. 6 are arranged repeatedly.

The electronic device 200 may average the voltages of detection electrodes connected to the same edge of regions having the same coercivity. For example, the voltages of the first detection electrode 211 and the fifth detection electrode 215 may be averaged for use. With such a configuration, the effect of variability in the contact resistances or the like between the detection electrodes and the topological insulator 20 can be reduced.

Figure 13:
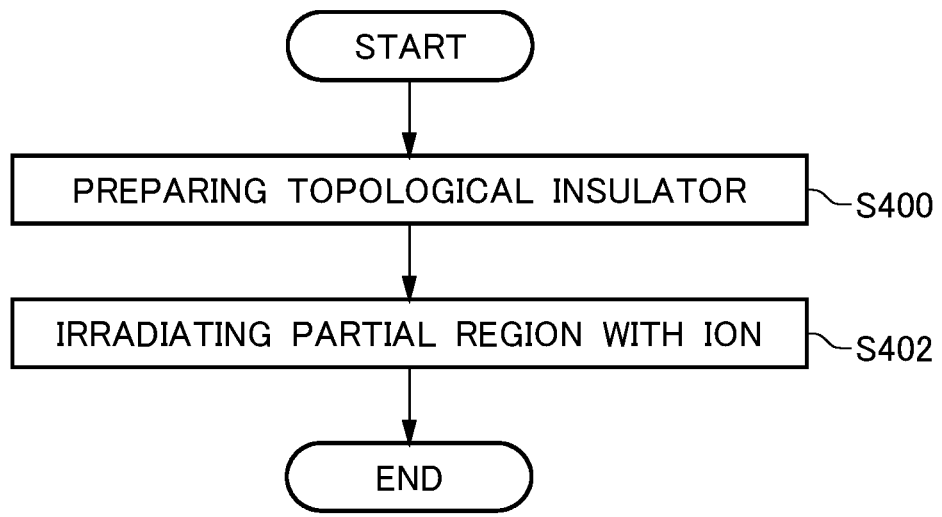
FIG. 13 is a flowchart showing an example of a fabrication method of the topological insulator 20.

FIG. 13 is a flowchart showing an example of a fabrication method of the topological insulator 20. First, a topological insulator having magnetism and the first coercivity is prepared (S400). In S400, a topological insulator having a thin-film shape may be formed on the upper surface of an InP substrate or the like.

Then, a partial region of the surface of the prepared topological insulator is irradiated with ions of argon or the like (S402). In S402, argon ions are accelerated with an accelerating voltage of 400 V or more, for example, to irradiate the surface of the topological insulator. The ion irradiation damages a partial region of the topological insulator and changes the coercivity. In this manner, the topological insulator 20 having a plurality of regions with magnetism and different coercivities can be fabricated.

Figure 14:
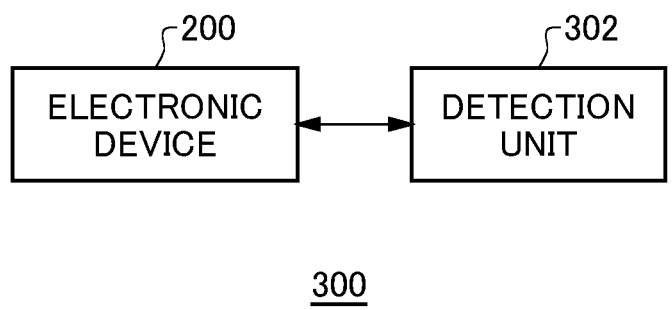
FIG. 14 is a block diagram showing an example of a memory device 300.

FIG. 14 is a block diagram showing an example of a memory device 300. The memory device 300 is a device for storing information and includes an electronic device 200 and a detection unit 302. The electronic device 200 is any one of the electronic devices 200 described with reference to FIGS. 1 to 12.

The detection unit 302 detects the direction of magnetization of each of the first region 21 and the second region 22 of the topological insulator 20 included in the electronic device 200. As described with reference to FIGS. 7A to 7C for example, the detection unit 302 may detect the direction of magnetization based on the potential differences between a plurality of pairs of detection electrodes. The direction of magnetization of each region corresponds to one bit of information.

For example, when the potential difference between the first detection electrode 211 and the second detection electrode 212 is zero, the potential difference between the third detection electrode 213 and the fourth detection electrode 214 is zero, and the potential difference between the first detection electrode 211 and the third detection electrode 213 is $V_L - V_R$, the detection unit 302 determines that the directions of magnetization of the first region 21 and the second region 22 are both the negative direction. The detection unit 302 may use the sign of the potential difference between the first detection electrode 211 and the third detection electrode 213. In this case, the detection unit 302 detects two bits of information "00", for example.

When the potential difference between the first detection electrode 211 and the second detection electrode 212 is zero, the potential difference between the third detection electrode 213 and the fourth detection electrode 214 is zero, and the potential difference between the first detection electrode 211 and the third detection electrode 213 is $V_R-V_L$, the detection unit 302 determines that the directions of magnetization of the first region 21 and the second region 22 are both the negative direction. The detection unit 302 may use the sign of the potential difference between the first detection electrode 211 and the third detection electrode 213. In this case, the detection unit 302 detects two bits of information "11", for example.

When the potential difference between the third detection electrode 213 and the fourth detection electrode 214 is $V_L-V_R$, the detection unit 302 may determine that the direction of magnetization of the first region 21 is the positive direction and the direction of magnetization of second region 22 is the negative direction. In this case, the detection unit 302 detects two bits of information "10", for example.

When the potential difference between the first detection electrode 211 and the second detection electrode 212 is $V_L-V_R$, the detection unit 302 may determine that the direction of magnetization of the first region 21 is the negative direction and the direction of magnetization of second region 22 is the positive direction. In this case, the detection unit 302 detects two bits of information "01", for example.

As described above, the energy dissipation of current flowing along the edges of the topological insulator 20 is zero, and therefore the power consumption in the memory device 300 when the detection unit 302 reads information can be made very low. Also, even if the storage capacity of the memory device 300 is increased, the increase ratio of power consumption relative to the increase ratio of the storage capacity is very small.

Also, the memory device 300 may further include a writing unit to write information in the electronic device 200. When information is written in each region, the magnitude of an external magnetic field to be applied to the topological insulator 20 is preset on the writing unit. The magnitude of the external magnetic field can be set based on the magnetization curve of each region of the topological insulator 20.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: substrate, 12: insulating film, 14: electrode, 20: topological insulator, 21: first region, 22: second region, 23: third region, 24: fourth region, 25: first edge, 26: second edge, 28: boundary, 100: structure, 200: electronic device, 201: first drive electrode, 202: second drive electrode, 211: first detection electrode, 212: second detection electrode, 213: third detection electrode, 214: fourth detection electrode, 215: fifth detection electrode, 216: sixth detection electrode, 217: seventh detection electrode, 218: eighth detection electrode, 300: memory device, 302: detection unit

What is claimed is:

1. An electronic device comprising:
   a first drive electrode;
   a second drive electrode that is spaced apart from the first drive electrode;
   a topological insulator that (i) contacts both of the first drive electrode and the second drive electrode, (ii) has magnetism, (iii) includes a first region having a first coercivity and a second region having a second coercivity that is different from the first coercivity, and (iv) has a first edge and a second edge, each positioned between the first drive electrode and the second drive electrode, wherein a boundary between the first region and the second region extends from the first edge to the second edge;
   a first detection electrode connected to the first region at the first edge; and
   a second detection electrode connected to the second region at the first edge.

2. The electronic device according to claim 1, wherein the topological insulator has a thin-film shape, and the first edge and the second edge are opposing edges of a predetermined surface of the thin-film shape.

3. The electronic device according to claim 2, wherein the topological insulator is a material represented by Formula 4, or is a material that is formed of a material represented by Formula 4 and a material not containing an element M and has a super-lattice structure, and

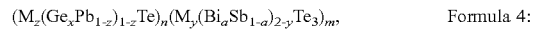

$(M_z(Ge_xPb_{1-z})_{1-z}Te)_n(M_y(Bi_aSb_{1-a})_{2-y}Te_3)_m$,    Formula 4:

wherein M is any of Ti, V, Cr, Mn, Fe, Co, Ni and Cu, 0<x<1, 0<a<1, 0<y<2 and 0<z<1, and n and m are any integers.

4. The electronic device according to claim 1, further comprising:
   a third detection electrode connected to the first region at the second edge; and
   a fourth detection electrode connected to the second region at the second edge.

5. The electronic device according to claim 3, wherein the topological insulator is a material represented by Formula 4, or is a material that is formed of a material represented by Formula 4 and a material not containing an element M and has a super-lattice structure, and

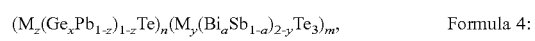

$(M_z(Ge_xPb_{1-z})_{1-z}Te)_n(M_y(Bi_aSb_{1-a})_{2-y}Te_3)_m$,    Formula 4:

wherein M is any of Ti, V, Cr, Mn, Fe, Co, Ni and Cu, 0<x<1, 0<a<1, 0<y<2 and 0<z<1, and n and m are any integers.

6. The electronic device according to claim 1, wherein the topological insulator further includes a third region having the first coercivity, and the second region is positioned between the first region and the third region.

7. The electronic device according to claim 4, wherein the topological insulator is a material represented by Formula 4, or is a material that is formed of a material represented by Formula 4 and a material not containing an element M and has a super-lattice structure, and $$(M_z(Ge_xPb_{1-z})_{1-z}Te)_n(M_y(Bi_aSb_{1-a})_{2-y}Te_3)_m,$$ Formula 4:

wherein M is any of Ti, V, Cr, Mn, Fe, Co, Ni and Cu, $0<x<1$, $0<a<1$, $0<y<2$ and $0<z<1$, and n and m are any integers.

8. The electronic device according to claim 1, wherein the topological insulator further includes a third region having a third coercivity that is different from the first coercivity and the second coercivity, and
the first region, the second region and the third region are arranged between the first drive electrode and the second drive electrode in order of magnitude of coercivity.

9. The electronic device according to claim 8, wherein the topological insulator is a material represented by Formula 4, or is a material that is formed of a material represented by Formula 4 and a material not containing an element M and has a super-lattice structure, and $$(M_z(Ge_xPb_{1-z})_{1-z}Te)_n(M_y(Bi_aSb_{1-a})_{2-y}Te_3)_m,$$ Formula 4:

wherein M is any of Ti, V, Cr, Mn, Fe, Co, Ni and Cu, $0<x<1$, $0<a<1$, $0<y<2$ and $0<z<1$, and n and m are any integers.

10. A memory device comprising:
the electronic device according to claim 1; and
a detection unit to detect a direction of magnetization of each of the first region and the second region in the electronic device.

11. The electronic device according to claim 1, wherein the topological insulator has a super-lattice structure.

12. An electronic device comprising:
a first drive electrode;
a second drive electrode that is spaced apart from the first drive electrode; and
a topological insulator that contacts both of the first drive electrode and the second drive electrode and has magnetism, wherein
the topological insulator includes a first region having a first coercivity and a second region having a second coercivity that is different from the first coercivity,
the topological insulator is a material represented by one of the group consisting of Formula 1, Formula 2, Formula 3, and Formula 4, or is a material that is formed of a material represented by one of the group consisting of Formula 1, Formula 2, Formula 3, and Formula 4 and a material not containing an element M and has a super-lattice structure, and $$M_z(Bi_{2-x}Sb_x)_{1-z}(Te_{3-y}Se_y),$$ Formula 1:

wherein M is any of Ti, V, Cr, Mn, Fe, Co, Ni and Cu, and $0<x<2$, $0<y<3$ and $0<z<1$, $$TlM_zM'_{1-z}X_2,$$ Formula 2:

wherein M is any of Ti, V, Cr, Mn, Fe, Co, Ni and Cu, M' is Bi or Sb, X is S or Se, and $0<z<1$, $$M_zPb_{1-z}(Bi_{1-x}Sb_x)_2Te_4,$$ Formula 3:

wherein M is any of Ti, V, Cr, Mn, Fe, Co, Ni and Cu, and $0<x<1$ and $0<z<1$, and $$(M_z(Ge_xPb_{1-z})_{1-z}Te)_n(M_y(Bi_aSb_{1-a})_{2-y}Te_3)_m,$$ Formula 4:

wherein M is any of Ti, V, Cr, Mn, Fe, Co, Ni and Cu, $0<x<1$, $0<a<1$, $0<y<2$ and $0<z<1$, and n and m are any integers.

13. A topological insulator having magnetism, comprising:
a first region having a first coercivity; and
a second region having a second coercivity that is different from the first coercivity, wherein
the topological insulator is a material represented by one of the group consisting of Formula 1, Formula 2, Formula 3, and Formula 4, or is a material that is formed of a material represented by one of the group consisting of Formula 1, Formula 2, Formula 3, and Formula 4 and a material not containing an element M and has a super-lattice structure, $$M_z(Bi_{2-x}Sb_x)_{1-z}(Te_{3-y}Se_y),$$ Formula 1:

wherein M is any of Ti, V, Cr, Mn, Fe, Co, Ni and Cu, and $0<x<2$, $0<y<3$ and $0<z<1$, $$TlM_zM'_{1-z}X_2,$$ Formula 2:

wherein M is any of Ti, V, Cr, Mn, Fe, Co, Ni and Cu, M' is Bi or Sb, X is S or Se, and $0<z<1$, $$M_zPb_{1-z}(Bi_{1-x}Sb_x)_2Te_4,$$ Formula 3:

wherein M is any of Ti, V, Cr, Mn, Fe, Co, Ni and Cu, and $0<x<1$ and $0<z<1$, and $$(M_z(Ge_xPb_{1-z})_{1-z}Te)_n(M_y(Bi_aSb_{1-a})_{2-y}Te_3)_m,$$ Formula 4:

wherein M is any of Ti, V, Cr, Mn, Fe, Co, Ni and Cu, $0<x<1$, $0<a<1$, $0<y<2$ and $0<z<1$, and n and m are any integers.

* * * * *